US006816103B2

(12) United States Patent
Jonsson et al.

(10) Patent No.: US 6,816,103 B2
(45) Date of Patent: *Nov. 9, 2004

(54) DYNAMIC ELEMENT MATCHING IN A/D CONVERTERS

(75) Inventors: Bengt Erik Jonsson, Spånga (SE); Christer Alf Jansson, Linköping (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 10/466,706

(22) PCT Filed: Feb. 13, 2002

(86) PCT No.: PCT/SE02/00239

§ 371 (c)(1),
(2), (4) Date: Jul. 17, 2003

(87) PCT Pub. No.: WO02/069502

PCT Pub. Date: Sep. 6, 2002

(65) Prior Publication Data

US 2004/0051657 A1 Mar. 18, 2004

(30) Foreign Application Priority Data

Feb. 27, 2001 (SE) .............................................. 0100663
Apr. 24, 2001 (SE) .............................................. 0101423

(51) Int. Cl.[7] .............................................. H03M 1/36
(52) U.S. Cl. ........................ 341/160; 341/144; 341/155
(58) Field of Search ................................ 341/143, 144, 341/155, 120, 161, 150, 163, 145

(56) References Cited

U.S. PATENT DOCUMENTS 5,404,142 A   4/1995 Adams et al. .............. 341/144
5,936,562 A * 8/1999 Brooks et al. .............. 341/143
5,977,899 A * 11/1999 Adams ....................... 341/145
6,124,813 A * 9/2000 Robertson et al. .......... 341/143
6,154,162 A   11/2000 Watson et al. .............. 341/150
6,218,977 B1 * 4/2001 Friend et al. ............... 341/163
6,348,884 B1 * 2/2002 Steensgaard-Madsen .... 341/118
6,348,888 B1 * 2/2002 Yu ............................. 341/161
6,486,807 B2 * 11/2002 Jonsson ...................... 341/120
6,545,623 B1 * 4/2003 Yu ............................. 341/155

OTHER PUBLICATIONS

Brooks, Todd L. et al., "A Cascaded Sigma–Delta Pipeline A/D Converter . . . ", IEEE Journal of Solid–State Circuits, vol. 32, No. 12, Dec. 1997.
Carbone, P. et al., "Distortionless Analog–To–Digital Conversion", Instrumentation And Measurement Technology Conference, , 1997, IMTC/97. Proceedings. Sensing, Processing, Networking., IEEE, vol. 1, pp. 636–639.
Galton, Ian, "Digital Cancellation of D/A Converter Noise in Piplined A/D Converters", IEEE Transactions on Circuits and Systems–II: Analog and Digital Signal Processing, vol. 47, No. 3, Mar. 2000.
Kaess, F. et al., "New Encoding Scheme for High–Speed Flash ADCs", 1997 IEEE International Symposium on Circuits and Systems, Jun. 9–12, 1997, Hong Kong.
Rombouts, P. et al., "Dynamic Element Matching for Piplined A/D Conversion", 1998 IEEE International Conference on Electronics, Circuits and Systems. Surfing the Waves of Science and Technology, vol. 2, Sept. 7–9, 1998, Portugal.

* cited by examiner

Primary Examiner—Jean Bruner Jeanglaude
(74) Attorney, Agent, or Firm—Nixon & Vanderhye P.C.

(57) ABSTRACT

An A/D converter stage including an A/D sub-converter connected to a D/A sub-converter provides dynamic element matching. This is accomplished by forcing comparators of the A/D sub-converter to generate a scrambled thermometer code.

25 Claims, 10 Drawing Sheets

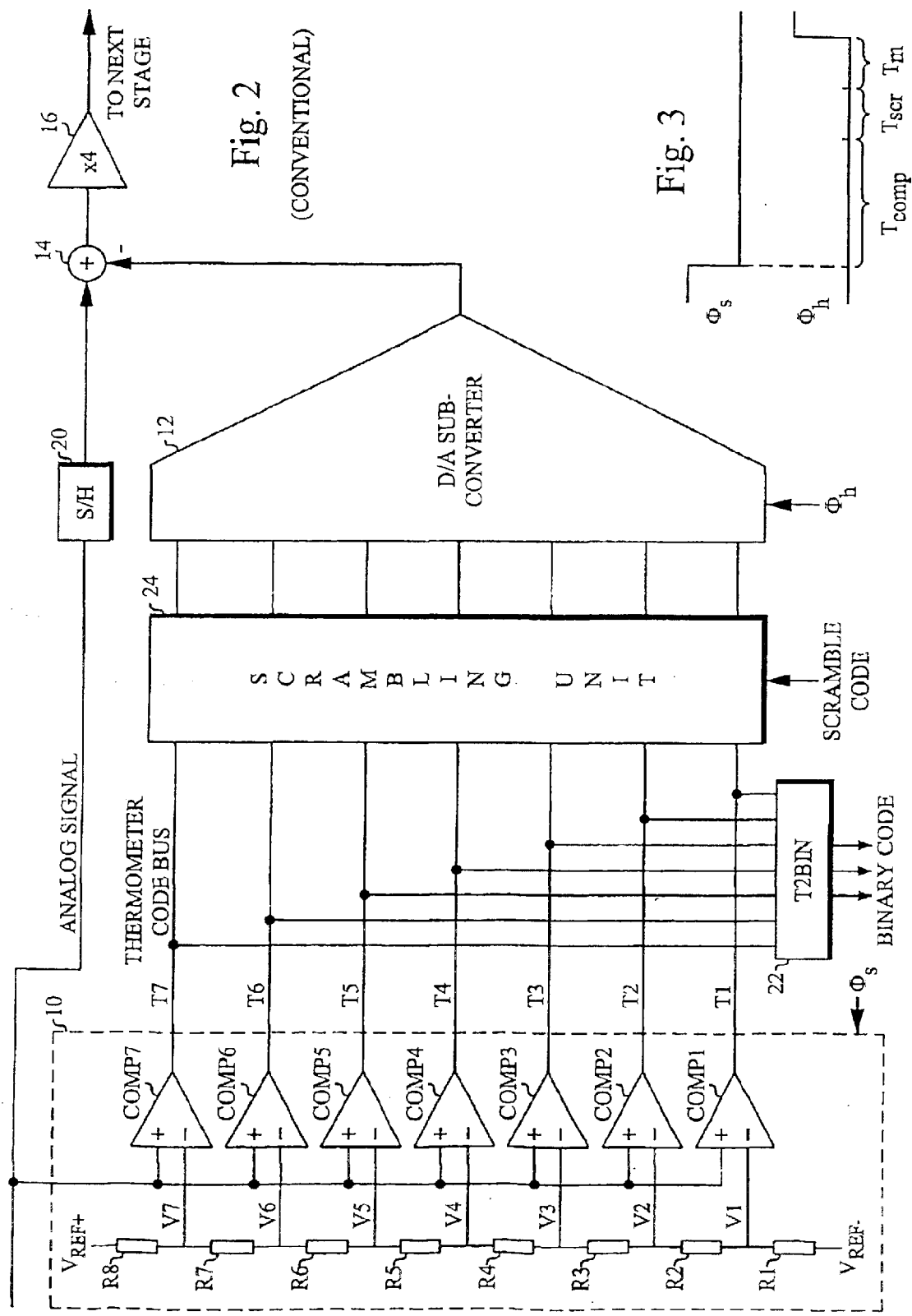
Fig. 2 (CONVENTIONAL)
Fig. 3

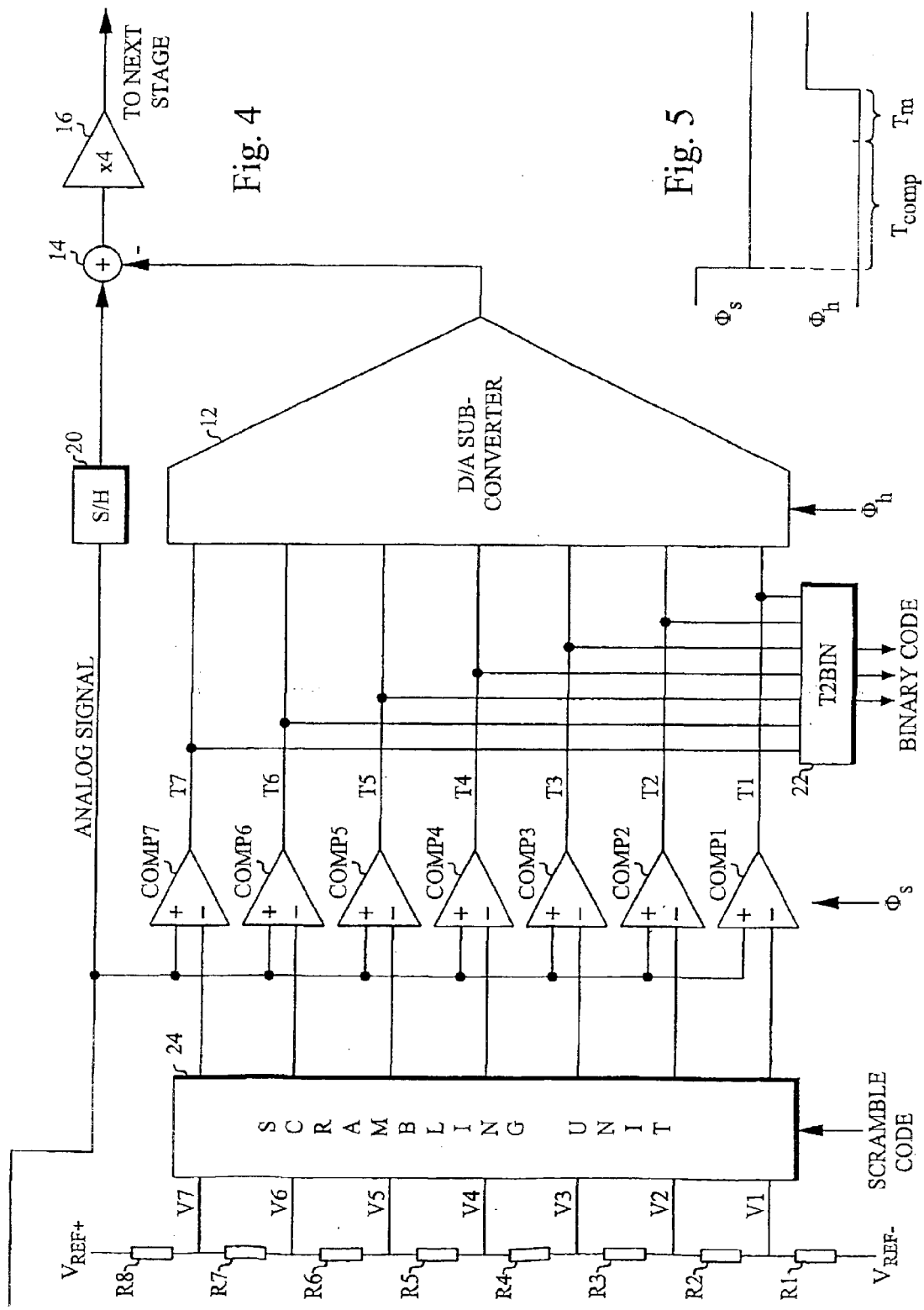

US 6,816,103 B2

DYNAMIC ELEMENT MATCHING IN A/D CONVERTERS

This application is the U.S. national phase of International Application PCT/SE02/00239 filed Feb. 13, 2002, which designated the U.S.

TECHNICAL FIELD

This invention relates to analog-to-digital converters (A/D converters), and in particular to dynamic element matching in multi-stage A/D converters, such as pipeline, sub-ranging, cyclic and multi-bit delta-sigma A/D converters.

BACKGROUND

The maximum achievable accuracy-speed performance of any A/D converter is limited by non-ideal effects associated with its building blocks. Typically, the performance is limited by settling time, finite amplifier gain, and/or component mismatch. When designing high-speed, high-accuracy A/D converters, these limitations impose stringent demands on building blocks, leading to prolonged design time and lower yield.

In many cases dynamic element matching can be used to reduce the negative impact of the non-ideal effects by randomizing the errors. For example, references [1–3] describe scrambling of the thermometer code bus to achieve dynamic element matching. The non-linearity of the A/D converter then appears as a random noise which increases the noise floor instead of producing harmonic distortion and intermodulation.

A problem with the prior art dynamic element matching implementations is that extra logic is required on the time critical thermometer code bus. This results in an extra signal delay, which has a negative impact on the maximal achievable sample rate.

SUMMARY

An object of the present invention is to provide dynamic element matching for A/D converters without this extra signal delay.

This object is achieved in accordance with the attached claims.

Briefly, the present invention implements dynamic element matching outside of the thermometer code bus by forcing the comparators of the A/D sub-converter of a stage to produce a scrambled thermometer code. This eliminates the extra delay on the thermometer code bus, thereby increasing the attainable sample rate.

BRIEF DESCRIPTION OF THE DRAWINGS

The invention, together with further objects and advantages thereof, may best be understood by making reference to the following description taken together with the accompanying drawings, in which:

FIG. 2 is a block diagram of a typical stage of the A/D converter in FIG. 1 with conventional scrambling;

FIG. 3 is a diagram illustrating timing of essential control signals in the A/D converter stage in FIG. 2;

FIG. 4 is a block diagram of an exemplary embodiment of an A/D converter stage in accordance with the present invention;

FIG. 5 is a diagram illustrating timing of essential control signals in the A/D converter stage in FIG. 4;

DETAILED DESCRIPTION

In the following description the same reference designations will be used for the same or similar elements.

The description below will primarily describe the present invention with reference to a pipeline A/D converter. However, it is appreciated that the same principles may also be used for other multi-stage A/D converters, such as sub-ranging, multi-bit delta-sigma or cyclic A/D converters (although a cyclic converter is not literally a multi-stage converter, for the purposes of this description it is considered a multi-stage converter, since it performs A/D conversion in several steps by reusing an A/D converter stage).

Figure 1:
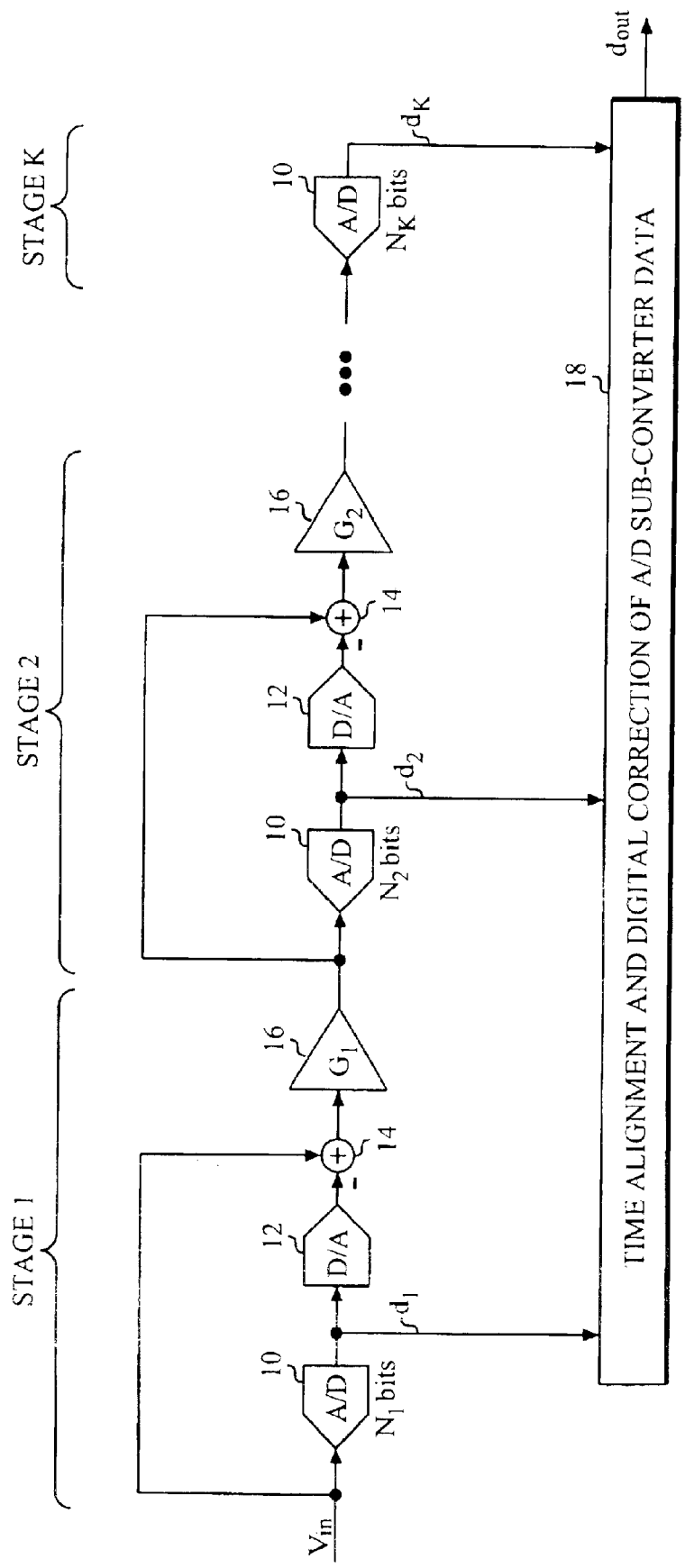
FIG. 1 is a block diagram of a typical pipeline A/D converter.

FIG. 1 is a block diagram of a typical pipeline A/D converter. An N-bit analog-to-digital conversion is performed in two or more stages, each stage extracting $\{N_1, N_2 \ldots N_k\}$ bits of information represented by the digital words $\{d_1, d_2 \ldots d_k\}$, where K is the number of pipeline stages. The first pipeline stage extracts the $N_1$ most significant bits using an $N_1$-bit A/D sub-converter 10. Then the estimated value is subtracted from the analog input signal $V_{in}$ by using a D/A sub-converter 12 and an adder 14, leaving a residue containing the information necessary to extract less significant bits. Usually the residue is amplified by an amplifier 16 having a gain $G_1$ to establish the appropriate signal range for stage 2. These steps are repeated for all K stages, with the exception of the last pipeline stage, which does not need to produce an analog output and therefore has no D/A converter, adder or amplifier, but only an A/D converter 10. The digital words $\{d_1, d_2 \ldots dK\}$ are then combined to form the digital output word $d_{out}$ in a unit 18 for time alignment and digital correction of A/D sub-converter data.

In order to simplify the following description, it is assumed that an A/D converter stage has a resolution of 3 bits. This number is sufficiently small to be manageable, but is also large enough to illustrate the essential features of a general case.

FIG. 2 is a block diagram of a typical stage of the A/D converter in FIG. 1. A/D sub-converter 10 includes a number of comparators COMP1–COMP7. One input terminal of each comparator is connected to a corresponding reference voltage V1–V7. These reference voltages are formed by a ladder of resistors R1–R8. During A/D conversion the other input terminal of each comparator receives the analog input signal (the same signal to each comparator). The output signals from the comparators collectively form the digitized value in thermometer code. These signals are forwarded to D/A sub-converter 12 over a thermometer code bus formed by lines T1–T7, where they are transformed into a corresponding analog value. This value is subtracted from the original analog value (which has been stored in a sample-and-hold circuit 20) in adder 14, and the residual signal is amplified by a gain equal to 4 in gain element 16. The bits from the stage are extracted by a thermometer-to-binary converter 22, which converts the thermometer code into binary code, typically by finding the transition from 1 to 0 in the thermometer code and looking up the corresponding position in a ROM to get the binary code.

Dynamic element matching is often used to randomize the errors of the A/D converter. The randomization is obtained by interchanging, in a pseudorandom manner, the elements whose inadequate matching generate unwanted spurious signals. In pipeline A/D converters this usually means that the elements in a D/A sub-converter 12 are to be interchanged by a scrambling unit 24 controlled by a pseudo random scramble code. The interchange is typically performed by scrambling the thermometer code bits produced by A/D sub-converter 10 before the signals are applied to the D/A sub-converter. Such scrambling decorrelates D/A sub-converter errors from the input signal. Thus, the errors now appear as random noise and not as a systematic error.

FIG. 3 is a diagram illustrating the timing of control signals $\Phi_s$ and $\Phi_h$ that control A/D sub-converter 10 and D/A sub-converter 12, respectively, in the A/D converter stage in FIG. 2. The A/D sub-converter decision phase starts when control signal $\Phi_s$ goes down. However, D/A conversion in D/A converter 12 can not start at the same time, due to the delays $T_{comp}$ and $T_{scr}$ introduced by the comparators of A/D sub-converter 10 and scrambling unit 24, respectively. Furthermore, there is a safety margin $T_m$ to ensure repetitive settling of the succeeding D/A sub-converter independently of the comparator delays, which are not precisely known. Thus, the total delay before D/A conversion starts by $\Phi_h$ going high is:

$$T_{total\ delay} = T_{comp} + T_{scr} + T_m$$

However, the total delay should be as short as possible, since a shorter delay translates into a higher attainable sample rate. Furthermore, scrambling unit 24 is often implemented as a multi-layer butterfly structure (an example will be described with reference to FIG. 6). Each layer introduces a delay. Since the required number of layers in the butterfly structure increases with the number of extracted bits per stage, this means that the delay $T_{scr}$ will also increase for higher resolution stages. As a typical example, the delay by each layer may be 0.2 ns, which for a 3 layer butterfly structure results in a delay $T_{scr}$ of 0.6 ns. This may be compared to a typical delay $T_{comp}$ of 0.6 ns and a margin $T_m$ of 0.2 ns. Thus, the total delay in this example is 1.4 ns.

FIG. 4 is a block diagram of an exemplary embodiment of an A/D converter stage in accordance with the present invention. In this embodiment scrambling unit 24 has been moved from the thermometer code bus to the "comparator threshold bus" formed by lines V1–V7. During scrambling lines V1–V7 (and thus the reference voltages) to comparators COMP1–COMP7 are interchanged in accordance with a scramble code, thereby forcing A/D sub-converter 10 to produce a scrambled code on the thermometer code bus (since the analog input signal is the same on all comparators, it does not matter which comparator is assigned a certain threshold level).

FIG. 5 is a diagram illustrating the timing of control signals $\Phi_s$ and $\Phi_h$ in the A/D converter stage in FIG. 4. Since scrambling unit 24 has been removed from the thermometer code bus, the total delay on the bus will now be:

$$T_{total\ delay} = T_{comp} + T_m$$

Since the comparators are still present in the converter, the conversion delay $T_{comp}$ will still remain. Using the exemplary delay values above, there is a delay reduction of more than 40%. This reduction may be used to increase the attainable sample rate.

Figure 6:
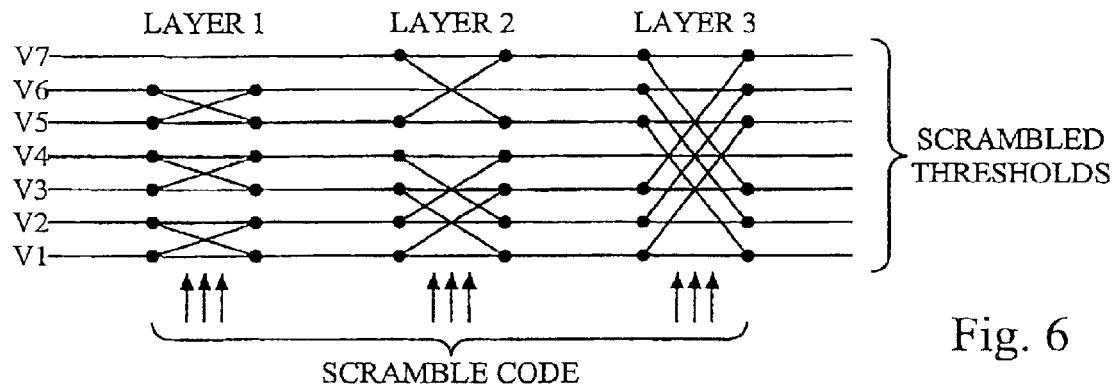
FIG. 6 illustrates an exemplary scrambling unit implemented as a butterfly network.

FIG. 6 illustrates an exemplary scrambling unit 24 implemented as a butterfly network. In this embodiment thresholds V1–V7 pass 3 switch layers, which are controlled by a scramble code (9 bits in the example). If a code bit is "low", the corresponding switch does not alter the signals. On the other hand, if the bit is "high", the switch will exchange the corresponding threshold pair. By providing different scramble codes in a pseudo random fashion, it is possible to combine the switches in the layers in different exchange combinations, thereby implementing "scrambling".

Since converter 22 will now receive a scrambled thermometer code (in the prior art the proper thermometer code was available), it has to be slightly modified. A possible solution is to insert a de-scrambling unit between the (scrambled) thermometer code bus and converter 22. This de-scrambling unit may simply comprise the same butterfly network as in FIG. 6, but with reversed input and output sides. In this way the same scramble code may be used for both the scrambling and de-scrambling unit. The de-scrambled signals may then be converted to binary form in a conventional manner.

Figure 7:
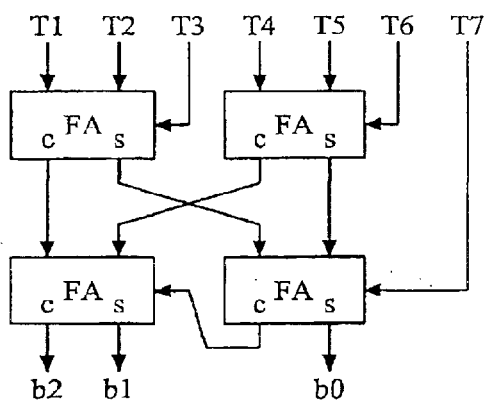
FIG. 7 illustrates an exemplary embodiment of a thermometer-to-binary converter suitable to be used in connection with the present invention.

Another possibility is to implement converter 22 as a Wallace tree decoder (see [4]), as illustrated in FIG. 7. The Wallace tree includes a number of interconnected full adders. At the first (top in FIG. 7) level each adder counts the number of "ones" at its inputs T1–T3 and T4–T6, respectively, and outputs a 2-bit coded word s,c (sum and carry). At the second level further full adders add the 2-bit words from the previous level and also add the remaining signal T7. This gives the binary code b2,b1,b0 for a 3-bit converter.

Figure 8:
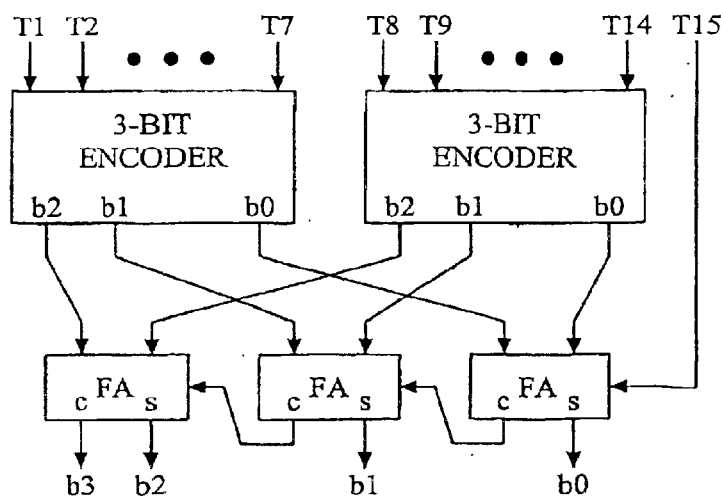
FIG. 8 illustrates another exemplary embodiment of a thermometer-to-binary converter suitable to be used in connection with the present invention.

FIG. 8 illustrates another exemplary embodiment of a thermometer-to-binary converter suitable to be used in connection with the present invention. This converter is suitable for a 4-bit A/D sub-converter. The 3-bit converter of FIG. 7 is used as a building block, and the outputs from two such blocks are combined as illustrated in FIG. 8. For higher resolutions the same principle, namely to interconnect outputs from lower resolution converters, may be repeated.

Thus, the Wallace tree is a simple and compact structure to implement thermometer-to-binary conversion. Due to the tree structure, the length of the signal propagation is short. It can also easily be pipelined, which means that it will never be a speed limiting factor in the A/D converter.

Figure 9:
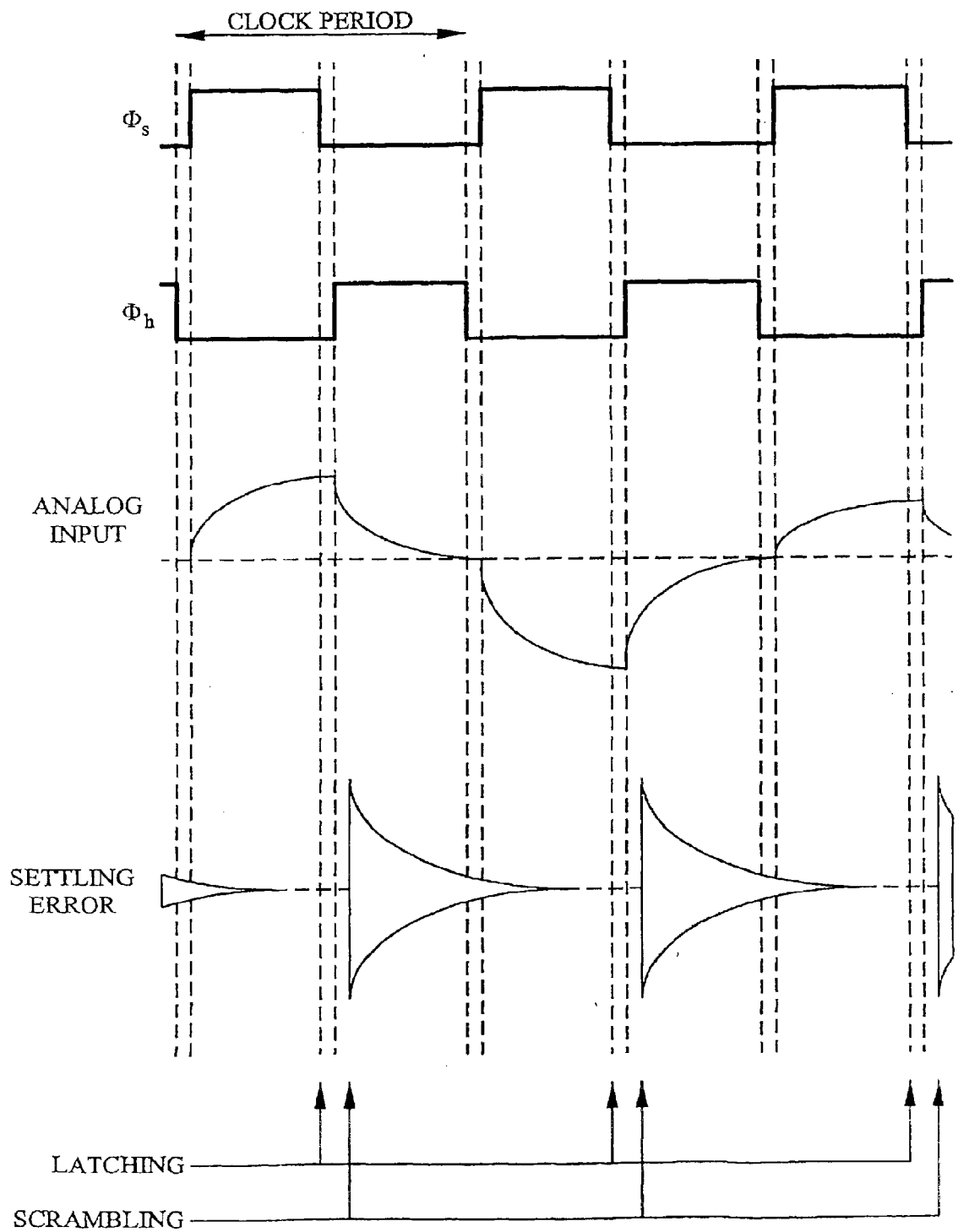
FIG. 9 is a timing diagram illustrating settling times for threshold level errors due to scrambling.

Scrambling of thresholds causes transients on the threshold code bus. These transients need some settling time before stable levels are obtained. FIG. 9 is a timing diagram illustrating settling times for threshold level errors due to scrambling. This diagram is applicable for an embodiment in accordance with FIG. 4. In such an embodiment the thresholds are forwarded to the comparators for direct comparison with the analog signal. The comparator input could, for example, comprise a differential stage of a pre-amplifier or an input to a latch, which preferably is regenerative. The top of FIG. 9 illustrates the clock phases $\Phi_s$ and $\Phi_h$ controlling the A/D and D/A sub-converter, respectively. The middle part of FIG. 9 illustrates an analog signal, and the bottom part illustrates the threshold settling error after scrambling. Latching of the comparators is performed at the falling edge of $\Phi_s$. Threshold scrambling is performed shortly after the rising edge of $\Phi_h$. As may be seen from the FIG. 9, more than half a clock period is available for scrambled threshold settling, since a scrambled threshold does not have to be stable until the next latching instant.

Figure 10:
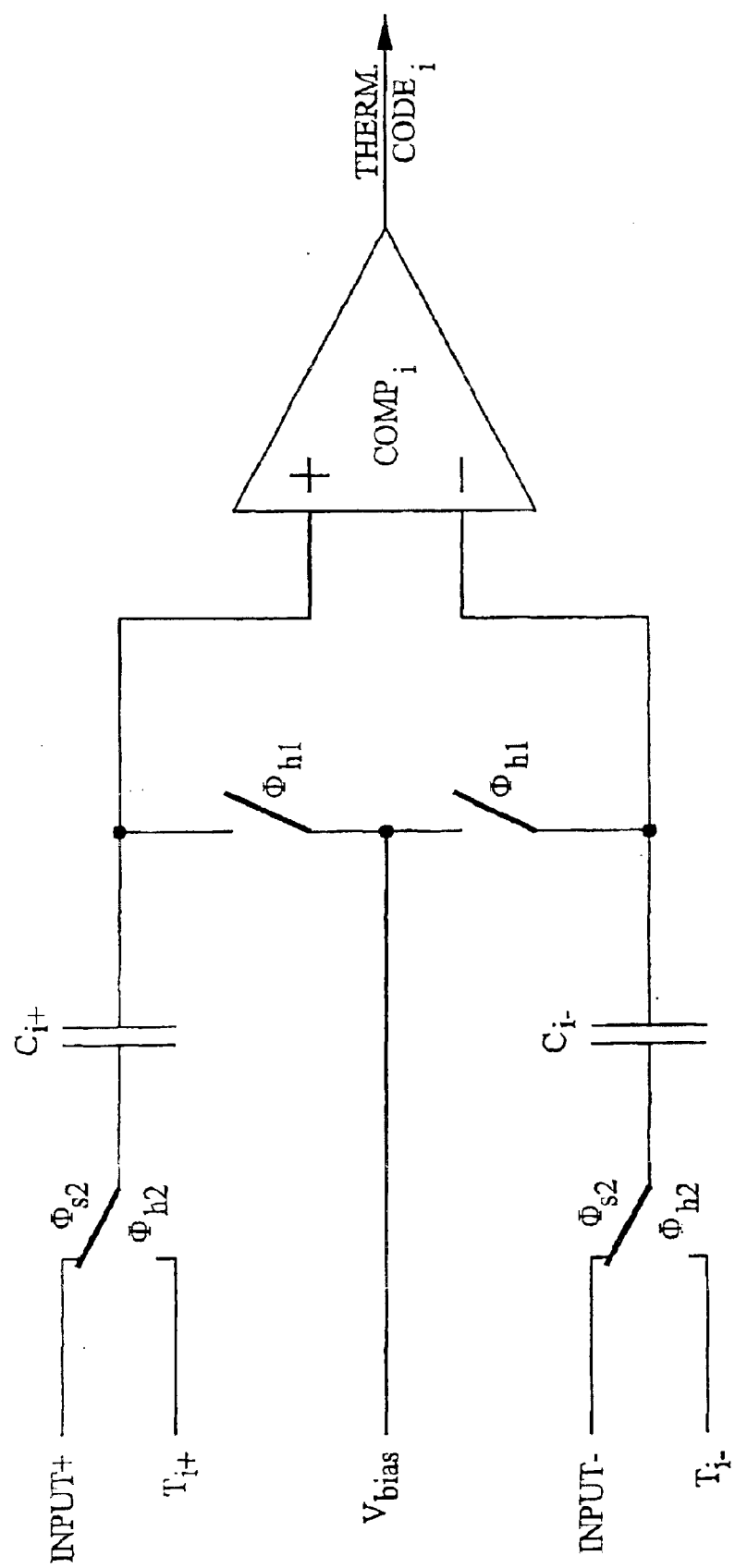
FIG. 10 illustrates an exemplary embodiment of a comparator input stage.

FIG. 10 illustrates an exemplary embodiment of a comparator input stage suitable for handling differential input signals. In this embodiment the thresholds are sampled onto capacitors for use in the next clock phase. The clock phases $\Phi_{s2}$ and $\Phi_{h2}$ correspond to $\Phi_s$ and $\Phi_h$, respectively, whereas $\Phi_{h1}$ is a slightly leading version of $\Phi_h$.

Figure 11:
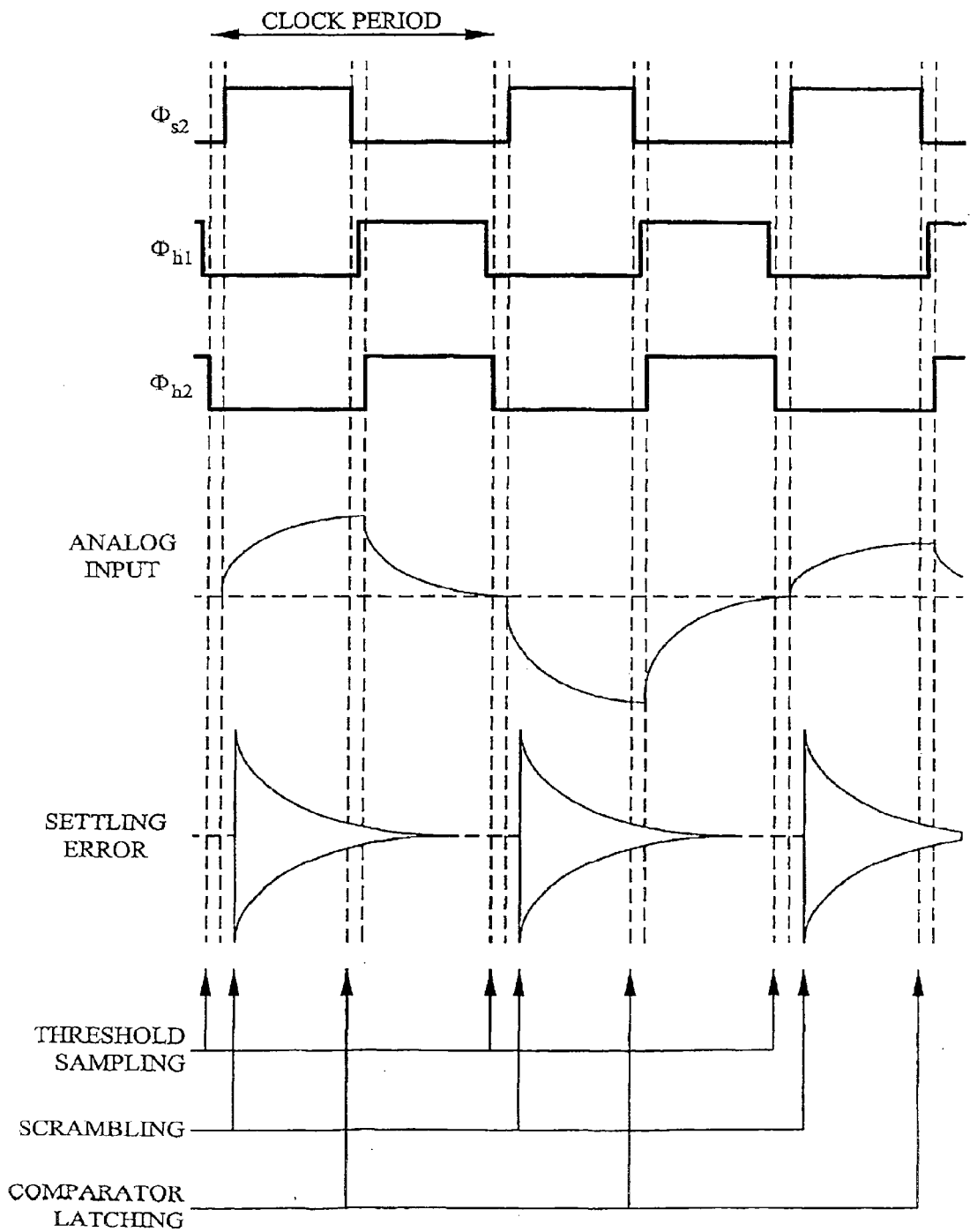
FIG. 11 is a timing diagram illustrating settling times for threshold level errors due to scrambling in the embodiment of FIG. 10.

FIG. 11 is a timing diagram illustrating settling times for threshold level errors due to scrambling in the embodiment of FIG. 10. High signals $\Phi_{h2}$ and $\Phi_{s2}$ correspond to capacitor input switches in correspondingly designated switch states in FIG. 10. A high signal $\Phi_{h1}$ corresponds to closed (conducting) switches designated by $\Phi_{h1}$ in FIG. 10. Since the thresholds are not sampled simultaneously with comparator latching, there is still more than half a clock period available for threshold settling. Thus, although the scrambled thresholds have not yet settled at the time of comparator latching (when the analog signal is compared to the previously sampled thresholds), these scrambled thresholds still have almost half a clock period to settle before they are to be sampled at the next falling edge of $\Phi_{h2}$.

Figure 12:
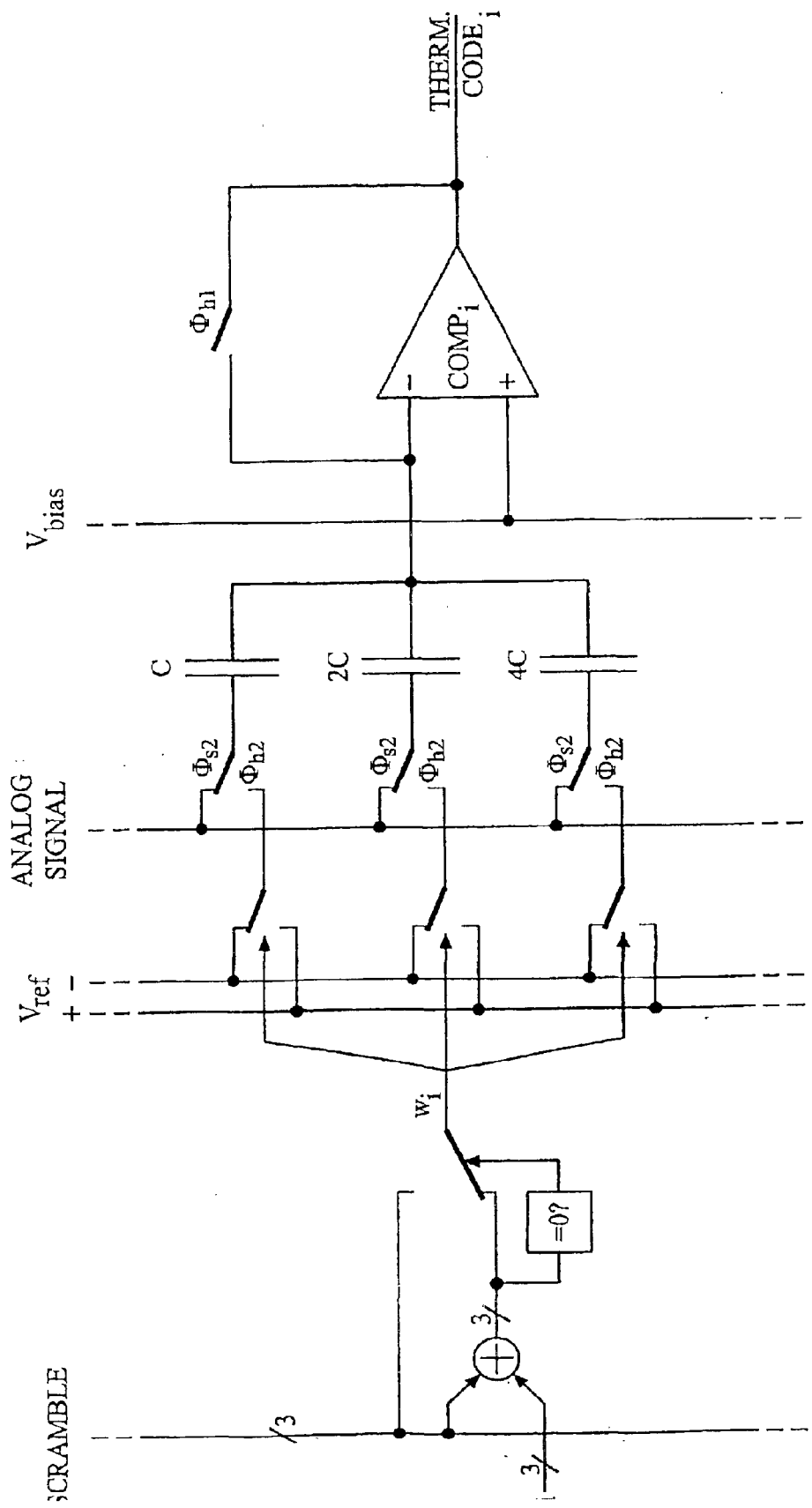
FIG. 12 illustrates an exemplary embodiment of a comparator input stage based on switched capacitor threshold generation.

The present invention is not limited to threshold voltages generated by resistance ladders. As a further example, FIG. 12 illustrates an embodiment of a comparator input stage based on switched capacitor threshold generation. The figure illustrates the input stage of comparator i of a 3-bit single-ended A/D sub-converter. An adder adds a 3-bit scramble code to the 3-bit representation of the comparator number i, which represents the default threshold. The carry is ignored in the addition. The resulting signal, when non-zero, forms a threshold word wi, from which each bit controls a corresponding switch for selecting a reference voltage, either $V_{ref+}$ or $V_{ref-}$. During clock phase $\Phi_{h2}$ the selected reference voltages are forwarded to a weighted capacitor array, which forms the scrambled threshold. In this embodiment scrambling is accomplished by circulating the default threshold code (in the adder), and the pseudo-random scramble code determines the number bit positions to circulate. Since a zero threshold word corresponds to a threshold level that is not used, a resulting zero code from the adder is replaced by the scramble code (this is accomplished by the switch after the adder), which is non-zero (between 1 and 7 in the illustrated embodiment). The reason for this choice is that no threshold word from the adder will comprise the scramble code, since this would imply that threshold word 000 has been added, which is not a valid default threshold word (threshold words vary between 1 and 7 in the illustrated embodiment).

Figure 13:
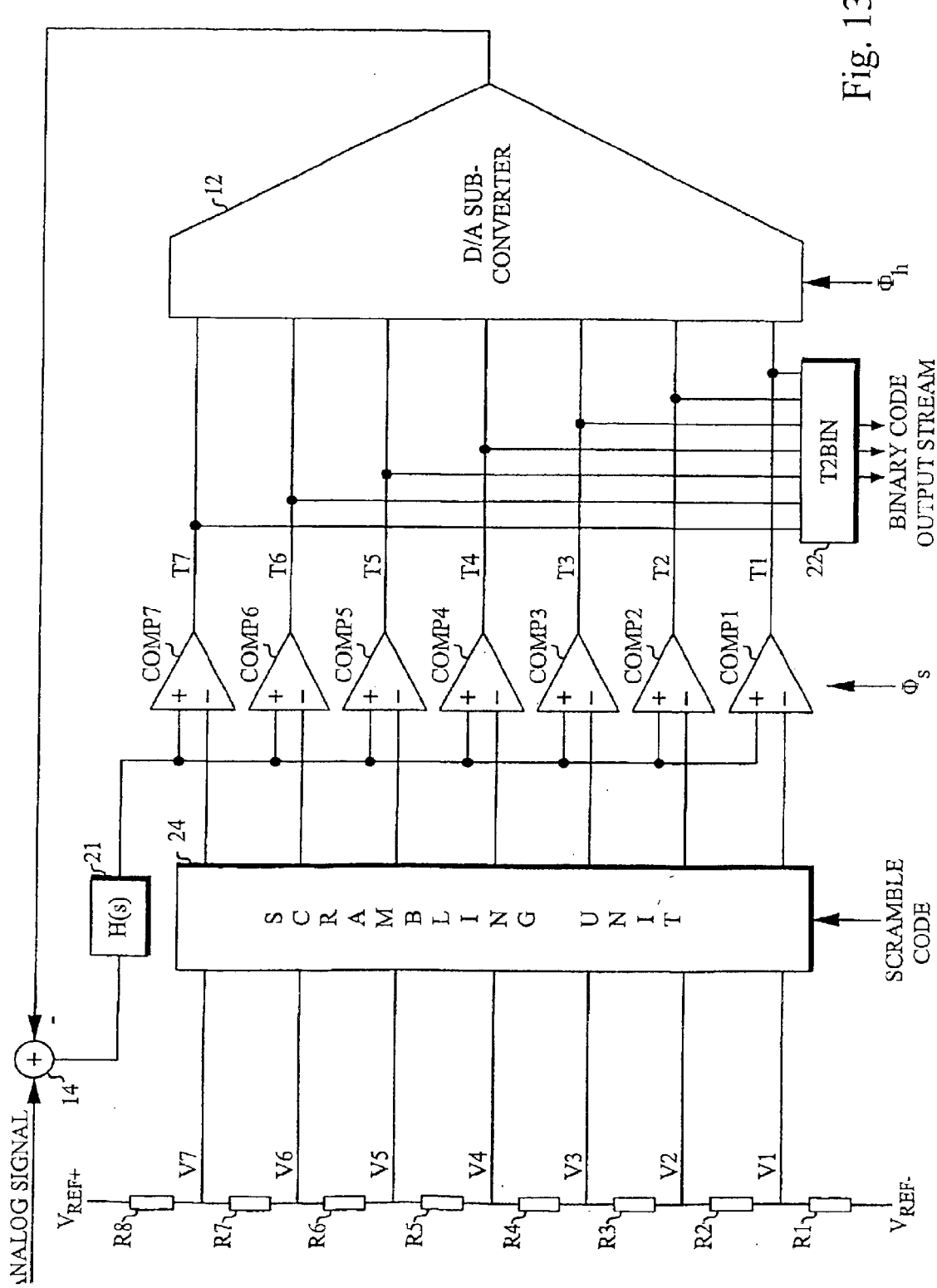
FIG. 13 illustrates an exemplary embodiment of a stage in a multi-bit delta-sigma A/D converter configured in accordance with the present invention.

FIG. 13 illustrates an exemplary embodiment of a stage in a multi-bit delta-sigma A/D converter configured in accordance with the present invention. The illustrated embodiment is a continuous time multi-bit delta-sigma A/D converter with a continuous time filter 21, typically an integrator for implementing a lowpass delta-sigma converter, and clocked comparators and D/A sub-converter.

It is also possible to implement a discrete time converter, for example by implementing the integrator as a switched capacitor filter and by having continuous time (non-clocked) comparators and D/A sub-converter. In this case $\Phi_s$ and $\Phi_h$ will control the integrator instead.

Figure 14:
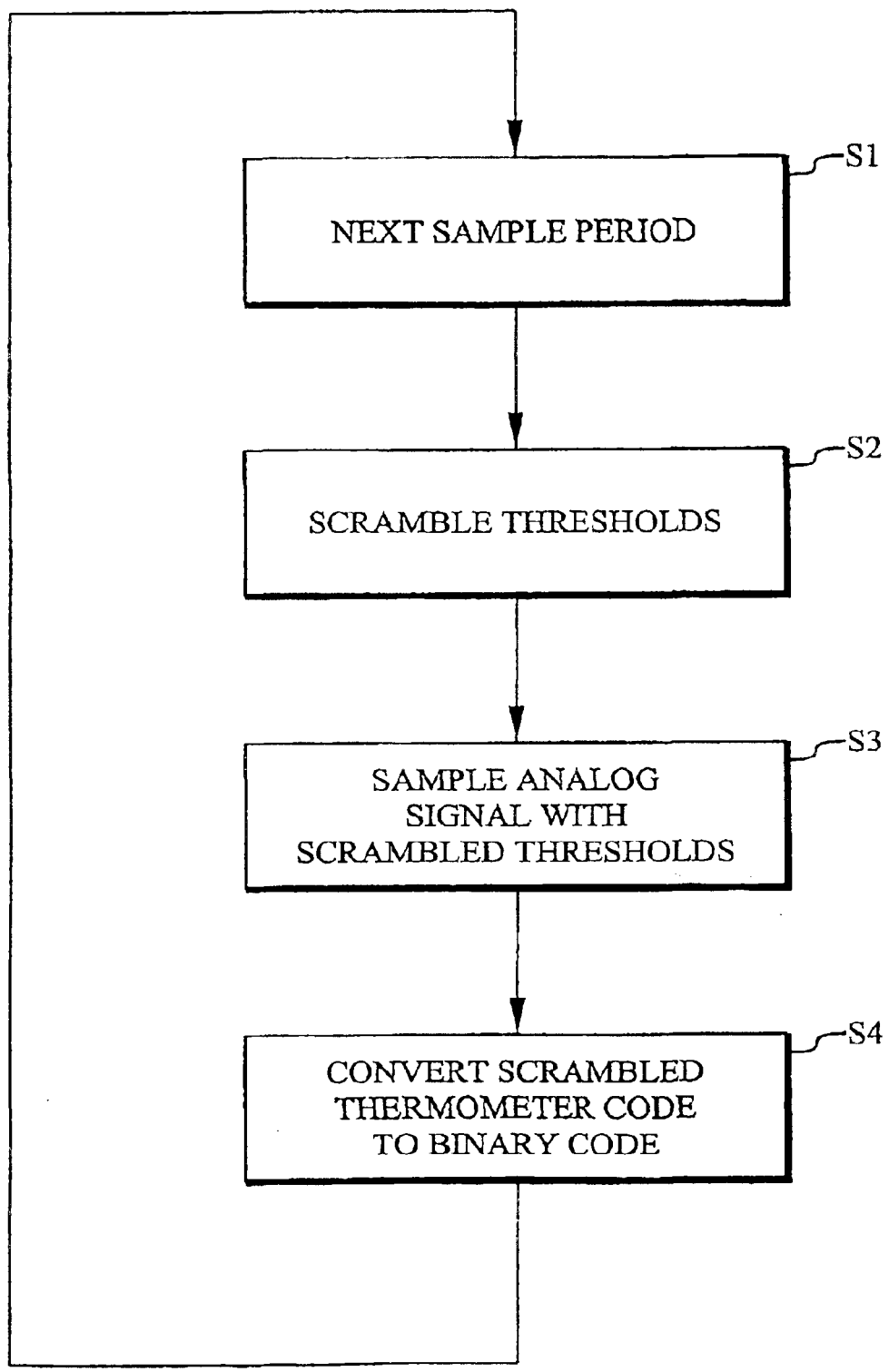
FIG. 14 is a flow chart illustrating the method in accordance with the present invention.

FIG. 14 is a flow chart illustrating the method in accordance with the present invention. Step S1 represents the start of a new sample period. Step S2 scrambles the threshold levels. Step S3 samples the analog input signal with scrambled comparator thresholds. Step S4 converts the resulting scrambled thermometer code to binary code. Then the procedure returns to step S1 for the next sample period.

In the description above the A/D sub-converter comparator thresholds were modified to implement scrambling of the thermometer code outside of the thermometer code bus. An alternative would be to modify (offset) the analog input signal to each comparator. Still another possibility would be to adjust the internal comparator offsets.

The present invention makes it possible to randomize the D/A sub-converter errors without introducing any speed or dynamic range penalty. By randomizing errors, such errors in A/D-conversion turn out as noise rather than distortion and intermodulation. This is a great advantage in most radio systems, but also in many other applications. The invention can be used either stand alone or as a complement to calibration for high performance A/D converters.

It will be understood by those skilled in the art that various modifications and changes may be made to the present invention without departure from the scope thereof, which is defined by the appended claims.

REFERENCES

[1] Ian Galton, "Digital Cancellation of D/A Converter Noise in Pipelined A/D Converters," IEEE Transactions on Circuits and Systems-II: Analog and Digital Signal Processing, Vol. 47, No. 3, March 2000.

[2] Todd L. Brooks, David H. Robertson, Daniel F. Kelly, Anthony Del Muro, and Stephen W. Harston, "A Cascaded Sigma-Delta Pipeline A/D Converter with 1.25 MHz Signal Bandwidth and 89 dB SNR," IEEE Journal of Solid-State Circuits, Vol. 32, No. 12, December 1997.

[3] P. Rombouts and L. Weyten, "Dynamic element matching for pipelined A/D conversion," 1998 IEEE International Conference on Electronics, Circuits and Systems. Surfing the Waves of Science and technology, vol. 2, Sep. 7–9, 1998, Portugal.

[4] F. Kaess, R. Kanan, B. Hochet and M. Declercq, "New Encoding Scheme for High-Speed Flash ADCs", 1997 IEEE International Symposium on Circuits and Systems, Jun. 9–12, 1997, Hong Kong.

What is claimed is:

1. A dynamic element matching method for a D/A sub-converter of an A/D converter stage, comprising:

controlling comparators of an A/D sub-converter to generate scrambled thermometer code, and de-scrambling said scrambled thermometer code before thermometer-to-binary code conversion.

2. The method of claim 1, including the step of modifying comparator thresholds for generating said scrambled thermometer code.

3. An apparatus for dynamic element matching in a D/A sub-converter of an A/D converter stage, comprising:

means for controlling comparators of an A/D sub-converter to generate scrambled thermometer code, and a Wallace tree for thermometer-to-binary code conversion of said scrambled thermometer code.

4. A dynamic element matching method for a D/A sub-converter of an A/D converter stage, comprising:
controlling comparators of an A/D sub-converter to generate scrambled thermometer code, and
Wallace tree decoding for thermometer-to-binary code conversion of said scrambled thermometer code.

5. An apparatus for dynamic element matching in a D/A sub-converter of an A/D converter stage, comprising:
means for controlling comparators of an A/D sub-converter to generate scrambled thermometer code, and
means for de-scrambling said scrambled thermometer code before thermometer-to-binary code conversion.

6. The apparatus of claim 5, including means modifying comparator thresholds for generating said scrambled thermometer code.

7. An A/D converter stage including an A/D sub-converter, comprising:
means for controlling comparators of said A/D sub-converter to generate scrambled thermometer code, and
a Wallace tree for thermometer-to-binary code conversion of said scrambled thermometer code.

8. A multi-stage A/D converter, comprising:
means for dynamic element matching including means for controlling A/D sub-converter comparators to generate scrambled thermometer code, and
a Wallace tree for thermometer-to-binary code conversion of said scrambled thermometer code.

9. An A/D converter stage including an A/D sub-converter, comprising:
means for controlling comparators of said A/D sub-converter to generate scrambled thermometer code, and
means for de-scrambling said scrambled thermometer code before thermometer-to-binary code conversion.

10. The A/D converter stage of claim 9, including means modifying comparator thresholds for generating said scrambled thermometer code.

11. Apparatus comprising:
first control circuitry for controlling comparators of an A/D subconverter to generate scrambled thermometer code, and
a Wallace tree for thermometer-to-binary code conversion of said scrambled thermometer code.

12. A multi-stage A/D converter, comprising:
means for dynamic element matching; including means for controlling A/D sub-converter comparators to generate scrambled thermometer code, and
means for de-scrambling said scrambled thermometer code before thermometer-to-binary code conversion.

13. The A/D converter of claim 12, including means modifying comparator thresholds for generating said scrambled thermometer code.

14. The A/D converter of claim 12, wherein said A/D converter is a pipeline A/D converter.

15. The A/D converter of claim 12, wherein said A/D converter is a cyclic A/D converter.

16. The A/D converter of claim 12, wherein said A/D converter is a sub-ranging A/D converter.

17. The A/D converter of claim 12, wherein said A/D converter is a multi-bit delta-sigma A/D converter.

18. A apparatus comprising:
first control circuitry for controlling comparators of an A/D subconverter to generate scrambled thermometer code, and
second control circuitry for de-scrambling said scrambled thermometer code before thermometer-to-binary code conversion.

19. The apparatus in claim 18, wherein the apparatus is a multi-bit delta-sigma A/D converter.

20. The apparatus in claim 18, wherein the apparatus is a sub-ranging A/D converter.

21. The apparatus in claim 18, wherein the apparatus is a cyclic A/D converter.

22. The apparatus of claim 18, further comprising electronic circuitry for modifying comparator thresholds for generating said scrambled thermometer code.

23. The apparatus in claim 18, wherein the apparatus is an A/D converter stage including an A/D sub-converter.

24. The apparatus in claim 18, wherein the apparatus is a multi-stage A/D converter.

25. The apparatus in claim 18, wherein the apparatus is a pipeline A/D converter.

* * * * *